(12) United States Patent
Lee

(10) Patent No.: US 8,987,585 B2
(45) Date of Patent: Mar. 24, 2015

(54) SOLAR CELL AND METHOD FABRICATING THE SAME

(75) Inventor: Dong Keun Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/379,557

(22) PCT Filed: Oct. 28, 2010

(86) PCT No.: PCT/KR2010/007493
§ 371 (c)(1),
(2), (4) Date: Dec. 20, 2011

(87) PCT Pub. No.: WO2011/053025
PCT Pub. Date: May 5, 2011

(65) Prior Publication Data
US 2012/0097242 A1 Apr. 26, 2012

(30) Foreign Application Priority Data
Oct. 28, 2009 (KR) .................. 10-2009-0103076

(51) Int. Cl.
*H01L 27/14* (2006.01)
*H01L 27/142* (2014.01)
(Continued)

(52) U.S. Cl.
CPC ........ *H01L 27/1423* (2013.01); *H01L 27/1426* (2013.01); *H01L 27/14* (2013.01);
(Continued)

(58) Field of Classification Search
CPC ... H01L 31/18; H01L 31/73265; H01L 27/14; H01L 27/1422; H01L 27/1425; H01L 27/1426

USPC .......................................................... 136/244
See application file for complete search history.

(56) References Cited

U.S. PATENT DOCUMENTS 6,107,563 A * 8/2000 Nakanishi et al. ............ 136/256
6,297,442 B1 * 10/2001 Yagi et al. ..................... 136/256
(Continued)

FOREIGN PATENT DOCUMENTS

JP H05-075155 A 3/1993
JP H05-308148 A 11/1993
(Continued)

OTHER PUBLICATIONS

W.-C. huang, C.-T. Ho, W.-C. Wang, "Fabrication of a high resolution periodical structure using a replication rocess", Optics Express, vol. 13, 2005, p. 6685-6692.*
(Continued)

*Primary Examiner* — Jennifer Michener
*Assistant Examiner* — Marla D McConnell
(74) *Attorney, Agent, or Firm* — Saliwanchik, Lloyd & Eisenschenk

(57) ABSTRACT

A solar cell according to an embodiment includes a pattern layer arranged on a substrate and including a uneven pattern; a back electrode arranged on the pattern layer; a light absorption layer arranged on the back electrode; a buffer layer on the light absorption layer; and a front layer arranged on the buffer layer.
The method fabricating a solar cell according to an embodiment includes forming a pattern layer including a uneven pattern on a substrate; forming a back electrode on the pattern layer; forming a light absorption layer on the back electrode; forming a buffer layer on the light absorption layer; and forming a front electrode on the buffer layer.

15 Claims, 4 Drawing Sheets

(51) Int. Cl.
   *H01L 31/18* (2006.01)
   *H01L 31/00* (2006.01)
   *H01L 31/0392* (2006.01)
   *H01L 31/0749* (2012.01)

(52) U.S. Cl.
   CPC ........... *H01L 31/18* (2013.01); *H01L 31/0392* (2013.01); *H01L 31/0749* (2013.01); *H01L 27/1425* (2013.01); *H01L 27/1422* (2013.01); *Y02E 10/541* (2013.01)
   USPC ............................ 136/255; 136/244; 136/249

(56) References Cited

U.S. PATENT DOCUMENTS

| | | | |
|---|---|---|---|
| 2001/0037825 A1* | 11/2001 | Nakano et al. | 136/256 |
| 2008/0072958 A1* | 3/2008 | Dutta | 136/256 |
| 2008/0245408 A1 | 10/2008 | Ito et al. | |
| 2009/0194150 A1 | 8/2009 | Aoki | |
| 2010/0269906 A1 | 10/2010 | Ota et al. | |
| 2010/0288329 A1 | 11/2010 | Hong et al. | |

FOREIGN PATENT DOCUMENTS

| | | | |
|---|---|---|---|
| JP | 2003-298084 A | 10/2003 | |
| JP | 2003-298086 A | 10/2003 | |
| JP | 2007-201304 A | 8/2007 | |
| JP | 2008-258540 A | 10/2008 | |
| JP | 2009-021479 A | 1/2009 | |
| KR | 2005-150242 A | 6/2005 | |
| KR | 10-2008-0107181 A | 12/2008 | |
| KR | 10-2009-0068110 A | 6/2009 | |
| WO | WO 2009082137 A2 * | 7/2009 | |

OTHER PUBLICATIONS

International Search Report in International Application No. PCT/KR2010/007493, filed Oct. 28, 2010.
Supplementary European Search Report dated Oct. 9, 2013 in European Application No. 10827109.9, filed Oct. 28, 2010.
Office Action dated Apr. 8, 2014 in Japanese Application No. 2012-536683.
Office Action dated Jul. 29, 2014 in Japanese Application No. 2012-536683.

* cited by examiner

SOLAR CELL AND METHOD FABRICATING THE SAME

CROSS-REFERENCE TO RELATED APPLICATIONS

This application is the U.S. national stage application of International Patent Application No. PCT/KR2010/007493, filed Oct. 28, 2010, which claims priority to Korean Application No. 10-2009-0103076, filed Oct. 28, 2009, the disclosures of each of which are incorporated herein by reference in their entirety.

BACKGROUND OF THE INVENTION

1. Technical Field

The present invention relates to a solar cell and a method fabricating the same.

2. Description of the Related Art

In recent, as the demand of the energy increases, developments for the solar cell converting solar energy into electrical energy are proceeding.

Particularly, a CIGS-base solar cell, that is, p-n hetero junction device having a substrate structure including a substrate, a metal back electrode layer, p-type CIGS-base light absorption layer, a high-resistant buffer layer, n-type transparent electrode layer and the like is widely used.

Various types of substrates may be used as the substrate, but when the substrate is flexible, in the case that the substrate is curved, there is problem in that the crack occurs in the metal back electrode layer formed on the substrate.

SUMMARY OF THE INVENTION

An advantage of some aspects of the invention is that it provides a solar cell and a method fabricating the same capable of increasing coupling force between the substrate and the back electrode.

A solar cell according to the embodiment includes a pattern layer arranged on a substrate and including an uneven pattern; a back electrode arranged on the pattern layer; a light absorption layer arranged on the back electrode; a buffer layer arranged on the light absorption layer; and a front layer arranged on the buffer layer.

The method fabricating a solar cell according to an embodiment includes forming a pattern layer including an uneven pattern on a substrate; forming a back electrode on the pattern layer; forming a light absorption layer on the back electrode; forming a buffer layer on the light absorption layer; and forming a front electrode on the buffer layer.

DESCRIPTION OF THE PREFERRED EMBODIMENTS

Figure 1:
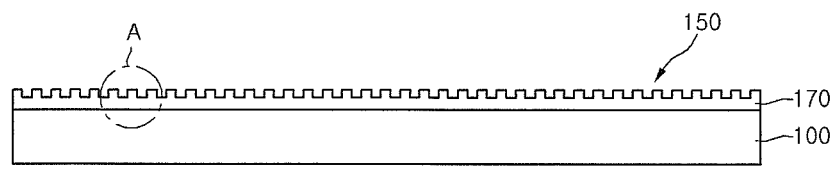
FIGS. 1 to 11 are sectional views showing the method of fabricating a solar cell according to an embodiment of the present invention.

In the description of the embodiment, in a case where each substrate, layer, a film or a electrode and the like is described to be formed "on" or "under" thereof, "on" or "under" also means one to be formed "directly" or "indirectly (through other component)" to component. Also, the criteria regarding "on" or "under" of each component will be described based on the drawings. In the drawing, the size of each component may be exaggerated to describe, and does not mean the size that is in fact applied.

Figure 11:
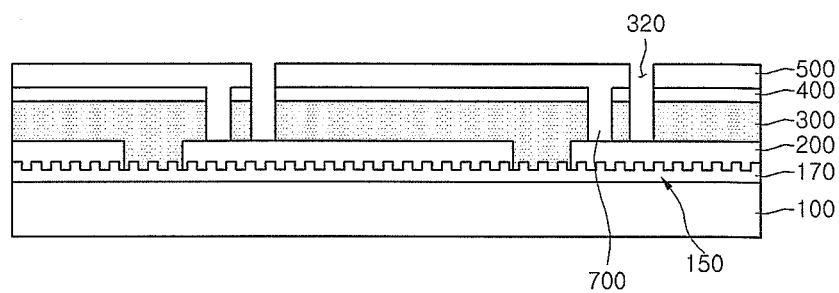

FIG. 11 is a section view of a solar cell according to an embodiment of the present invention.

As shown in FIG. 11, a solar cell of the embodiment includes a substrate 100, a pattern layer 170, a back electrode 200, a light absorption layer 300, a buffer layer 400 and a front electrode 500.

In this case, the pattern layer 170 includes an uneven pattern 150, curves having a quadrangular pyramid or sine wave shape may be periodically formed in the uneven pattern 150.

Figure 3:
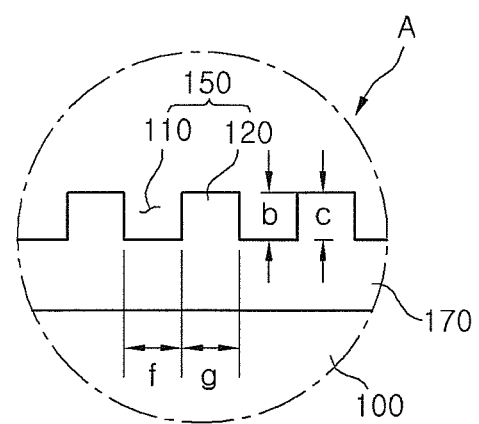

Further, as shown in FIG. 3, the uneven pattern 150 includes grooves 110 and protrusions 120, the width of the grooves is 100~300 nm, the width of the protrusions is 100~200 nm, and the height of the grooves and protrusions may be 100~300 nm.

The grooves 110 and the protrusions 120 are formed by an uneven structure, so the grooves 120 have the shape protruded from the substrate 100.

Further, the grooves 110 and the protrusions 120 allow a contact area to widen, it is possible to increase the combination between the substrate 100 and the back electrode formed hereafter.

Particularly, when the substrate 100 is flexible, although the substrate 100 is curved, it is possible to prevent generation of the crack in the back electrode by the pattern layer 170.

Further, the back electrode is formed even in the inside of the grooves 110 of the uneven pattern 150, so it is possible to increase the combination force the substrate 100 and the back electrode.

The pattern layer 170 may be formed by the material containing resin of single or mixture type such as epoxy, epoxy melanin, acrylic and urethane resin.

Hereinafter, the solar cell will be described in more detail according to the process of fabricating the solar cell.

FIGS. 1 to 11 are sectional views showing the method of fabricating the solar cell according to an embodiment of the present invention.

First, as shown in FIG. 1, the pattern layer 170 including the uneven pattern 150 is formed on the substrate 100.

The substrate 100 uses glass and also uses ceramic substrate such as alumina, stainless steel, titanium substrate or polymer substrate and the like, as the material thereof.

The glass substrate may use sodalime glass, and the polymer substrate may use PET (polyethylen terephthalate), and polyimide.

Further, the substrate 100 may be rigid or flexible.

After forming the resin layer on the surface of the substrate 100, the uneven pattern 150 may form the uneven pattern in the resin layer.

Figure 2:
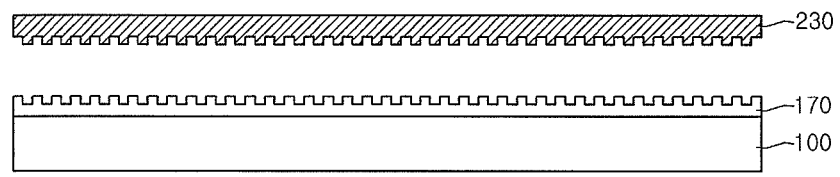

At this moment, as shown in FIG. 2, a method forming the pattern forms the resin layer on the substrate 100, and applies a molding process using a mold 230 while simultaneously applying UV hardening process.

When applying the resin layer on the substrate 100, it proceeds to a spin coating process.

The resin layer may be formed by the material containing resin of single or mixture type such as epoxy, epoxy melanin, acrylic and urethane resin.

However, the method forming the pattern is not limited thereto, after forming the resin layer on the substrate 100, it may be formed using laser light source.

Figure 4:
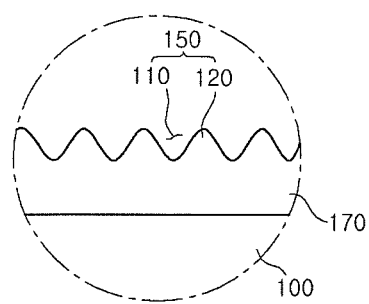

FIGS. 3 and 4 in detail show 'A' region of FIG. 1, the uneven pattern 150, the uneven pattern 150 includes the grooves 110 and the protrusions 120, and the curve of the uneven pattern 150 having a square pillar shape is periodically formed.

The grooves 110 and protrusions 120 are formed by an uneven structure, so the grooves 120 have the shape protruded from the substrate 100.

Further, the grooves 110 and the protrusions 120 allows a contact area to widen, so it is possible to increase coupling force between the substrate 100 and the back electrode formed hereafter.

Particularly, when the substrate 100 is flexible, although the substrate 100 is curved, tensile stress is transferred into the back electrode by the pattern layer 170, thereby to prevent the generation of the crack.

In this case, the width f of the grooves 110 is 100~300 nm, the width g of the protrusions 120 is 100~200 nm, and the height b of the grooves 110 and the height c of protrusions 120 may be 100~300 nm.

In the present embodiment, the uneven pattern 150 includes the grooves 110 and the protrusions 120, but is not limited thereto, and may be formed by the structure formed with the pattern capable of improving the coupling force with the back electrode to be formed later.

Although not shown in drawings, the uneven pattern 150 having a square pillar shape may be formed longer in one direction.

In this case, the uneven pattern 150 is not limited to the square pillar, as shown in FIG. 4, the curve of the uneven pattern 160 having a curved sine wave shape may be periodically formed.

The pattern layer 170 may be formed by the material containing resin of single or mixture type such as epoxy, epoxy melanin, acrylic and urethane resin.

When the substrate 100 is formed by the polymer substrate, that is, PET and polyimid, since the coupling force between the pattern layer 170 and the substrate 100 is strong, the coupling force between the substrate 100 and the back electrode to be formed later may be also strengthened.

Figure 5:
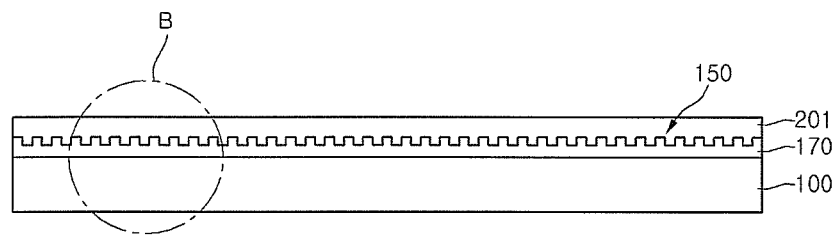
Figure 6:
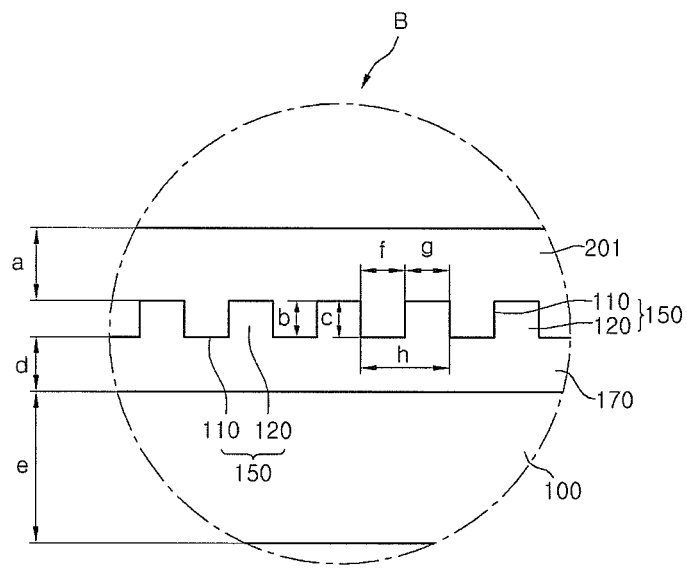

Further, as shown in FIGS. 5 and 6, the back electrode 201 is formed on the pattern layer 170.

The back electrode 201 becomes a conductive layer. The back electrode layer 201 allows charges produced from the light absorption layer 300 of the solar cell to move, such that current may flow outside the solar cell. The back electrode layer 201 should be have high electrical conductivity and small specific resistance to perform above function.

Further, The back electrode layer 201 should be maintained to have high temperature stability when heat-treating under the atmosphere of sulfur(S) or selenium (Se) accompanied in forming CIGS compound.

Such a back electrode 201 may be formed by any one of molybdenum (Mo), gold (Au), aluminum (Al), chromium (Cr), tungsten (W) and copper (Cu) Among them, particularly, the molybdenum (Mo) may allow the characteristic required for the back electrode layer 201 to generally satisfy.

The back electrode layer 201 may include at least two layers. In this case, each layer may be formed by same metal or metals different from each other.

At this moment, the back electrode 201 is also inserted into the inside of the grooves 110 of the uneven pattern 150 to increase the coupling force between the back electrode 201 and the substrate 100.

The side in which the back electrode 201 contacts the pattern layer 170 may be formed to have a concave-convex corresponding to the uneven pattern of the pattern layer 170, and a top surface of the back electrode 201 may be formed to have the side parallel to the substrate 100.

Particularly, when the substrate 100 is flexible, although the substrate 100 is curved by the difference in the thermal expansivity between the substrate and the back electrode, it is possible to prevent the generation of the crack between the substrate 100 and the back electrode, by the uneven pattern 150 formed on the substrate.

In this case, the thickness of the substrate 100 is thicker than that of the uneven pattern 150 and the back electrode 201, and the thickness of the back electrode 201 is thicker than that of the uneven pattern 150.

That is, the relationship about the thickness and the size of the substrate 100, the uneven pattern 150 and the back electrode 201 may be expressed as follows with reference to FIG. 6

$$(a+b)=W(c+d) \quad (1)$$

$$(c)=X(d) \quad (2)$$

$$(d)=Y(e) \quad (3)$$

$$(f)=Z(g) \quad (4)$$

Where, W has a value of 0.17~0.43, X has a value of 0.03~0.15, Y has a value of 0.04~0.12, and Z has a value of 1~2.

In the conditional expression, a is a distance from the top surface of the uneven pattern 150, that is, the top surface of the protrusions 120 to the top surface of the back electrode pattern 201, b is a height of the grooves 110, c is a height of the grooves 120, and d is a thickness from the bottom surface of the grooves 110 to the substrate 100 in the pattern layer 170.

Further, e is a thickness of the substrate 100, f is a width of the grooves 110, and g is a width of the protrusions 120.

The conditional expression (1) shows the relationship between the back electrode 201 and the pattern layer 170.

As shown in the conditional expression (1), (a+b), that is, the entire thickness of the back electrode 201 may become 0.17~0.43(W) times (c+d), that is, the entire thickness of the pattern layer 170.

In this case, when the value of the W is smaller than 0.17, the buffer layer, that is, the d region of the pattern layer 170 become thicker, thereby to reduce the adhesion between the substrate 100 and the pattern 170.

Further, when the value of the W is larger than 0.43, the difference in the thickness between the entire back electrode 201 and the pattern 170 is decreased, and therefore, d has not enough thickness in the pattern 170, such that the buffer function preventing the generation of the crack may be reduced.

The conditional (2) means the percentage of the protrusions 120 or the grooves 11 in the entire thickness of the pattern layer 170.

That is, the height c of the protrusions 120 may be 0.03~0.15(X) times d, that is, the thickness from the bottom surface of the grooves 110 to the substrate 100 in the pattern layer 170.

At this moment, when the value of X is smaller than 0.03, the height of the protrusions 120, that is, the value of c is too small, thereby reducing adhesion area with the back electrode 201 and simultaneously, the uneven pattern 150 is too small, thereby reducing the buffer function preventing the generation of the crack.

Further, when the value of X is larger than 0.15, the height of the protrusions 120, that is, the value of c becomes larger, and therefore, it is hard to manufacture the uneven pattern 150. Further, it is not deposited up to the bottom surface of the grooves 110 when depositing the back electrode 201, thereby to reduce the buffer function preventing the generation of the crack.

The conditional expression (3) shows the relationship between the substrate 100, and the region of d, that is, the thickness from the bottom surface of the grooves 110 to the substrate 100 in the pattern layer 170.

That is, the value of d, that is, the thickness of the pattern layer 170 from the bottom surface of the grooves 110 to the substrate 100 may become 0.04~0.12(Y) times the substrate 100.

At this moment, when the value of the Y is smaller than 0.04, the value of d is small, thereby to reduce the buffer function preventing the generation of the crack by the substrate 100.

Further, when the value of the Y is larger than 0.12, the thickness of the substrate 100 is relatively decreased, such that bending phenomenon easily occurs in the substrate, thereby to easily produce the crack.

The conditional expression (4) shows the relationship about the percentage between the widths f of the grooves 110 and the widths g of the protrusions 120.

That is, the width f of the grooves 110 may be 1~2(Z) times the width g of the protrusions 120.

Further, the period h of the uneven pattern 150 may be formed regularly or irregularly, and may be formed by the period of 200~500 nm.

Further, looking into the hardness of the substrate 100, and the uneven pattern 150 and the back electrode 201, the back electrode 201 is harder than the substrate 100 and the uneven pattern 150, and the hardness of the substrate 100 is harder than or equal to that of the uneven pattern 150.

Figure 7:
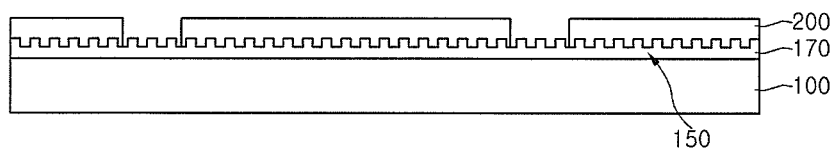

Subsequently, as shown in FIG. 7, the back electrode pattern 200 is formed by applying a patterning process to the back electrode 201.

The back electrode pattern 200 may be formed by applying a photolithography process to the back electrode 201.

Further, the back electrode pattern 200 may be arranged in a stripe type or a matrix type to correspond to each cell.

However, the back electrode pattern 200 is not limited to above type, and may be formed in various types.

At this moment, the portion of the uneven pattern 150 formed on the substrate 100 may be exposed through the back electrode pattern 200.

Figure 8:
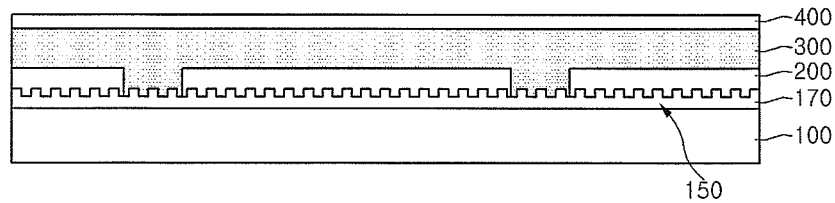

Next, as shown in FIG. 8, the light absorption layer 300 and the buffer layer 400 are formed on the back electrode pattern 200.

The light absorption layer 300 includes p-type semiconductor compound. In more detail, the light absorption layer 300 includes group I-III-VI-base compound. For example, The light absorption layer 300 may has copper-indium-gallium-selenide-base (Cu(In,Ga)Se2; CIGS-base) or copper-gallium-selenide-base crystal structure.

For example, to form the light absorption layer 300, a CIG-base metal precursor film is formed on the back electrode pattern 200 by using copper target, indium target and gallium target.

Hereinafter, the metal precursor film reacts with selenium by a selenization process to form a CIG-base light absorption layer 300.

Further, during the process forming the metal precursor film and the selenization process, alkali ingredients contained in the substrate 100 are diffused into the metal precursor film and the light absorption layer 300 through the back electrode pattern 200.

The alkali component improves a grain size of the light absorption layer 300 to improve crystallizability.

Further, the light absorption layer 300 may be formed by copper, indium, gallium and selenium (Cu, In, Ga and Se) by co-evaporation.

The light absorption layer 300 receives light incident from the outside, and converts the received light into electrical energy. The light absorption layer 300 produces light electromotive force generated by photoelectric effect.

At this moment, the portion of the light absorption layer 300 contacting the substrate 100 is also formed on the uneven pattern 150.

That is, the portion of the light absorption layer 300 is also coupled with the grooves 110 and the protrusions 120 of the uneven pattern 150, such that coupling force of the light absorption layer 300 and the substrate 100 may be increased.

The buffer layer 400 may be formed by at least one layer, may be formed by any one of cadmium sulfide (CdS), ITO, ZnO and i-ZnO or laminating of them on the substrate 100 formed with the light absorption layer 300, and may obtain low resistance by doping indium (In), gallium (Ga) and aluminum (Al).

At this moment, the buffer layer 400 is an n-type semiconductor layer, and the light absorption layer 300 is a p-type semiconductor layer. As a result, the light absorption layer 300 and the buffer layer 400 form pn-junction.

The buffer layer 400 is arranged between the light absorption layer 300, and the front electrode to be formed later.

That is, since the light absorption layer 300 and the front electrode have large difference in a lattice constant and band gap energy, to form good junction, a buffer layer to be positioned in the middle of the two materials is necessary due to the difference in the band gap.

In the present embodiment, although a buffer layer is formed on the light absorption layer 300, is not limited thereto, and the buffer layer 400 may be formed by a plurality of layers.

Figure 9:
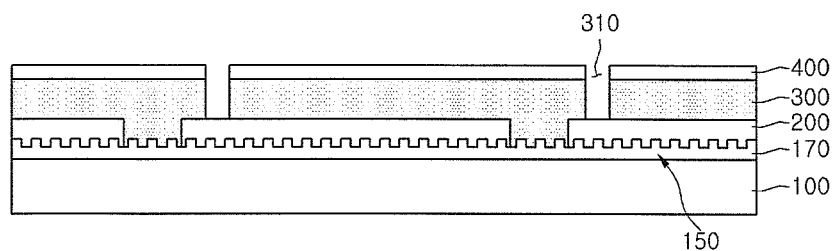

Subsequently, as shown in FIG. 9, contact patterns are formed through the light absorption layer 300 and the buffer layer 400.

The contact patterns 310 may be formed by applying a mechanical method or a process using laser, and the portion of the back electrode pattern 200 is exposed.

Figure 10:
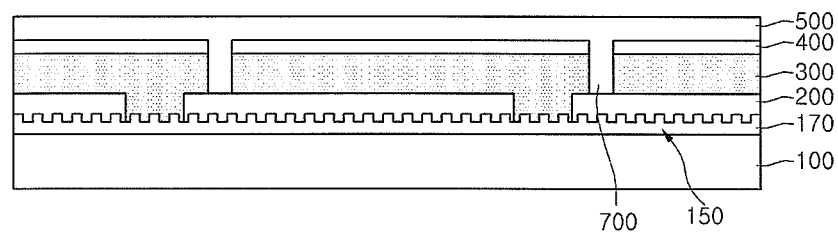

Further, as shown in FIG. 10, the front electrode 500 and a connecting interconnection 700 are formed by laminating transparent conductive material on the buffer layer 400.

When laminating the transparent material on the buffer layer 400, the transparent conductive material is also inserted into the inside of the contact pattern 310 to form the connecting interconnection 700.

The back electrode pattern 200 and the front electrode 500 are electrically connected to each other by the connecting interconnection 700.

The front electrode 500 is formed by zinc oxide doped with the aluminum by applying the sputtering process on the substrate 100.

The front electrode 500, which is a window layer forming the pn-junction with the light absorption layer 300, functions as the transparent electrode of the front of the solar cell, and therefore, is formed by the zinc oxide (ZnO) having high light transmittance and good electrical conductivity.

At this moment, the electrode having a low resistance may be formed by doping the aluminum to the zinc oxide.

The front electrode 500, that is, the zinc oxide thin film may be formed by a deposition method using ZnO target by RF sputtering method, reactive sputtering using Zn target, and metal organic chemical vapor deposition.

Further, it is also possible to form double structure by depositing ITO (Indium tin Oxide) thin film having excellent electro-optical characteristics on the zinc oxide thin film.

Subsequently, as shown in FIG. 11, separate patterns 320 are formed through the light absorption layer 300, the buffer layer 400, and the front electrode 500.

The separate patterns 320 may be formed by applying a mechanical method or a process using laser, and the portion of the back electrode pattern 200 is exposed.

The buffer layer 400, and the front electrode 500 may be divided by the separate pattern 320, and each of cells C1, C2 may be separated to each other by the separate pattern 320.

The light absorption layer 300, the buffer layer 400, and the front electrode 500 may be arranged in a stripe type or a matrix type by the separate pattern 320.

The separate pattern 320 is not limited to above type, and may be formed in various types.

The cells C1, C2 including the back electrode pattern 200, the light absorption layer 300, the buffer layer 400, and the front electrode 500 are formed by the separate pattern 320.

At this moment, each of the cells C1, C2 are connected to each other by the connecting interconnection 700. The back electrode pattern 200 of the second cell C2 and the front electrode 500 of the first cell C1 contacting the second cell C2 are connected to each other by the connecting interconnection 700.

The solar cell and method fabricating the same according to the embodiments described above may form the uneven pattern having a nano size on the substrate, thereby to increase the coupling force with the back electrode formed on the substrate.

Particularly, when the substrate is flexible, although the substrate is curved, the crack does not occur between the substrate and the back electrode.

That is, the back electrode is formed even in the inside of the grooves of the uneven structure pattern to increase the coupling force between the substrate and the back electrode.

The light absorption layer, in which the portion thereof contacts the substrate, also contacts the uneven structure pattern to increase the coupling force between the light absorption layer and the substrate.

The solar cell and method fabricating the same according to the embodiment may form the uneven pattern having a nano size on the substrate, thereby to increase the coupling force with the back electrode formed on the substrate.

Particularly, when the substrate is flexible, although the substrate is curved, the crack does not occur between the substrate and the back electrode.

That is, the back electrode is formed even in the inside of the grooves of the uneven structure pattern to increase the coupling force between the substrate and the back electrode.

Further, the light absorption layer, in which the portion thereof contacts the substrate, also contacts the uneven structure pattern to increase the coupling force between the light absorption layer and the substrate.

It is appreciated that the present invention can be carried out in other specific forms without changing a technical idea or essential characteristics by one having ordinary skilled in the art to which the present invention pertains to. Therefore, embodiments described above are for illustration purpose in all respect but not limited to them. The scope of the present invention is represented by claims described below rather than the detailed description, and any change and variations derived from the meaning, the scope and the concept of equality of claims should be interpreted to be included to the scope of the present invention.

In addition, although the preferred embodiments of the present invention are shown and described above, the present invention is not limited to above-described specific embodiment and is variously modified by one skilled in the art without the gist of the present invention claimed in the claim, such that the modified embodiment is not to be understood separately from technical ideas or views of the present invention.

What is claimed is:

1. A solar cell, comprising:
    a pattern layer arranged on a substrate and including an uneven pattern on the entire surface of the substrate, wherein the pattern layer is formed of a different material than the substrate is;
    a back electrode arranged on the pattern layer;
    a light absorption layer arranged on the back electrode, wherein a portion of the light absorption layer is formed on and in direct physical contact with the uneven pattern of the pattern layer;
    a buffer layer arranged on the light absorption layer; and
    a front electrode arranged on the buffer layer;
    wherein the pattern layer comprises a resin material comprising at least one material selected from the group consisting of epoxy, epoxy melanin, acrylic, and urethane resin,
    wherein the pattern layer comprises a flat bottom surface;
    wherein the entire flat bottom surface of the pattern layer has a uniform distance from an entire top surface of the light absorption layer;
    wherein the pattern layer comprises grooves and protrusions in the uneven pattern on a top surface thereof, and
    wherein the portion of the light absorption layer in direct physical contact with the uneven pattern of the pattern layer is in direct physical contact with at least one groove and at least one protrusion of the uneven pattern.

2. The solar cell according to claim 1, wherein a width of the grooves is from 100 nm to 300 nm, a width of the protrusions is from 100 nm to 200 nm, a height of the grooves and protrusions is from 100 nm to 300 nm, and a period of the uneven pattern including the grooves and the protrusions is from 200 nm to 500 nm.

3. The solar cell according to claim 1, wherein looking into the substrate, the pattern layer and the back electrode, when a is a distance from the top surface of the uneven pattern, that is, the top surface of the protrusions to the surface of the back electrode, b is the height of the grooves, c is the height of the grooves, and d is a thickness from the bottom surface of the grooves to the substrate in the pattern layer, a conditional expression of $(a+b)=W(c+d)$ is satisfied, where W has the value of from 0.17 to 0.43.

4. The solar cell according to claim 1, looking into the pattern layer, when c is the height of the grooves, and d is the thickness from the bottom surface of the grooves to the substrate in the pattern layer, the conditional expression of $(c)=X(d)$ is satisfied, where X has the value of from 0.03 to 0.15.

5. The solar cell according to claim 1, looking into the substrate and the pattern layer, when d is the thickness from the bottom surface of the grooves to the substrate in the pattern layer, and e is the thickness of the substrate, the conditional expression of $(d)=Y(e)$ is satisfied, where Y has the value of from 0.04 to 0.12.

6. The solar cell according to claim 1, wherein looking into the pattern layer, when f is the width of the grooves, and g is the width of the protrusions, the conditional expression of $(f)=Z(g)$ is satisfied, where Z has the value of from 1 to 2.

7. The solar cell according to claim 1, wherein the side in which the back electrode contacts the pattern layer is formed to have a concavo-convex pattern corresponding to the uneven pattern of the pattern layer, and the top surface of the back electrode is formed in parallel with the substrate.

8. The solar cell according to claim 1, wherein the width of the uneven pattern is narrowed from the substrate toward the back electrode.

9. A method of fabricating a solar cell, comprising:
forming a pattern layer including an uneven pattern on a substrate, wherein the pattern layer is formed of a different material than the substrate is;
forming a back electrode on the pattern layer;
forming a light absorption layer on the back electrode, wherein a portion of the light absorption layer is formed on and in direct physical contact with the uneven pattern of the pattern layer;
forming a buffer layer on the light absorption layer; and
forming a front electrode on the buffer layer;
wherein the pattern layer comprises a resin material comprising at least one material selected from the group consisting of epoxy, epoxy melanin, acrylic, and urethane resin;
wherein the pattern layer comprises a flat bottom surface;
wherein the entire flat bottom surface of the pattern layer has a uniform distance from an entire top surface of the light absorption layer;
wherein the pattern layer comprises grooves and protrusions in the uneven pattern on a top surface thereof, and
wherein the portion of the light absorption layer in direct physical contact with the uneven pattern of the pattern layer is in direct physical contact with at least one groove and at least one protrusion of the uneven pattern.

10. The method of fabricating a solar cell according to claim 9, wherein the forming the pattern layer includes forming a resin layer on the substrate; and forming the pattern layer formed with the uneven pattern by applying a molding process using mold to the resin layer and simultaneously applying UV hardening process.

11. The method of fabricating a solar cell according to claim 9, wherein the width of the grooves is from 100 nm to 300 nm, the width of the protrusions is from 100 nm to 200 nm, the height of the grooves and protrusions is from 100 nm to 300 nm, and a period of the uneven pattern including the grooves and the protrusions is from 200 nm to 500 nm.

12. The method of fabricating a solar cell according to claim 9, wherein looking into the substrate, the pattern layer and the back electrode, when a is a distance from the top surface of the uneven pattern, that is, the top surface of the protrusions to the surface of the back electrode, b is a height of the grooves, c is a height of the grooves, and d is a thickness from the bottom surface of the grooves to the substrate in the pattern layer, a conditional expression of $(a+b)=W(c+d)$ is satisfied, where W has the value of from 0.17 to 0.43.

13. The method of fabricating a solar cell according to claim 9, looking into the pattern layer, when c is a height of the grooves, and d is a thickness from the bottom surface of the grooves to the substrate in the pattern layer, a conditional expression of $(c)=X(d)$ is satisfied, where X has the value of from 0.03 to 0.15.

14. The method of fabricating a solar cell according to claim 9, looking into the substrate and the pattern layer, when d is the thickness from the bottom surface of the grooves to the substrate in the pattern layer, and e is the thickness of the substrate, the conditional expression of $(d)=Y(e)$ is satisfied, where Y has the value of from 0.04 to 0.12.

15. The method of fabricating a solar cell according to claim 9, looking into the pattern layer, when f is the width of the grooves, and g is the width of the protrusions, the conditional expression of $(f)=Z(g)$ is satisfied, where Z has the value of from 1 to 2.

* * * * *